(12) United States Patent
Choi et al.

(10) Patent No.: US 9,543,325 B2
(45) Date of Patent: Jan. 10, 2017

(54) ARRAY SUBSTRATE AND MANUFACTURING METHOD THEREOF, LIQUID CRYSTAL DISPLAY PANEL AND DISPLAY DEVICE

(71) Applicant: BOE TECHNOLOGY GROUP CO., LTD., Beijing (CN)

(72) Inventors: Seungjin Choi, Beijing (CN); Heecheol Kim, Beijing (CN); Youngsuk Song, Beijing (CN); Seongyeol Yoo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/500,007

(22) Filed: Sep. 29, 2014

(65) Prior Publication Data

US 2015/0380441 A1 Dec. 31, 2015

(30) Foreign Application Priority Data

Jun. 26, 2014 (CN) .......................... 2014 1 0298647

(51) Int. Cl.
*H01L 27/12* (2006.01)
*H01L 29/786* (2006.01)

(52) U.S. Cl.
CPC ......... *H01L 27/1222* (2013.01); *H01L 27/127* (2013.01); *H01L 27/1225* (2013.01); *H01L 29/7869* (2013.01)

(58) Field of Classification Search
CPC ............ H01L 27/1218; H01L 12/1225; H01L 27/1262; H01L 29/786; H01L 29/7869

(Continued)

(56) References Cited

U.S. PATENT DOCUMENTS

2007/0272922 A1\* 11/2007 Kim .................... H01L 29/7869
257/43
2008/0023703 A1\* 1/2008 Hoffman ............. H01L 29/7869
257/59

(Continued)

FOREIGN PATENT DOCUMENTS

| CN | 102651455 A | 8/2012 |
| CN | 102903674 A | 1/2013 |
| CN | 203967090 U | 11/2014 |

OTHER PUBLICATIONS

The First Office Action dated Jun. 27, 2016 corresponding to Chinese application No. 201410298647.7.

*Primary Examiner* — Anne Hines
(74) *Attorney, Agent, or Firm* — Nath, Goldberg & Meyer; Joshua B. Goldberg; Christopher Thomas

(57) ABSTRACT

An array substrate and a manufacturing method thereof, a liquid crystal display panel and a display device are provided, the array substrate comprises a base substrate, and thin film transistors and pixel electrodes provided on the base substrate, the pixel electrode and the active layer in the thin film transistor are provided in the same layer. The active layer is formed of transparent oxide semiconductor material, and the concentration of carriers in the oxide semiconductor material may be increased by performing a plasma process on the oxide semiconductor material, thus the pixel electrode may be manufactured by using the oxide semiconductor material used for manufacturing the active layer, thereby the pixel electrode and the active layer can be provided in the same layer, the number of the masks can be reduced, the manufacturing process is simplified, production cost is saved, the productivity is increased, and the manufacturing time is shortened.

17 Claims, 5 Drawing Sheets

(58) Field of Classification Search
USPC .............................................. 257/43; 349/43
See application file for complete search history.

(56) References Cited

U.S. PATENT DOCUMENTS

| | | | |
|---|---|---|---|
| 2011/0017989 A1* | 1/2011 | Chen .................... | H01L 27/1225 257/43 |
| 2012/0033152 A1* | 2/2012 | Ha ....................... | H01L 29/7869 349/43 |
| 2014/0131715 A1* | 5/2014 | Liu ...................... | H01L 27/1218 257/59 |
| 2014/0209895 A1* | 7/2014 | Wang .................. | H01L 27/1225 257/43 |
| 2015/0102339 A1* | 4/2015 | Sun ..................... | H01L 27/1225 257/43 |

* cited by examiner

ARRAY SUBSTRATE AND MANUFACTURING METHOD THEREOF, LIQUID CRYSTAL DISPLAY PANEL AND DISPLAY DEVICE

FIELD OF THE INVENTION

The invention relates to the field of display technology, and particularly, to an array substrate and a manufacturing method thereof, and a liquid crystal display panel and a display device.

BACKGROUND OF THE INVENTION

A liquid crystal display panel comprises an array substrate, an opposite substrate and a liquid crystal layer between the array substrate and the opposite substrate, wherein the array substrate is provide with thin film transistors and pixel electrodes on one side thereof facing to the liquid crystal layer. The thin film transistor generally comprises a gate, an active layer, a source and a drain. Specifically, the structure of a thin film transistor may be of a bottom-gate type or a top-gate type, taking the structure of bottom gate type as an example, as shown in FIG. 1, the thin film transistor comprises a base substrate 1, and a gate 2, a gate insulation layer 3, an active layer 4, an etching blocking layer 5, a source 6, a drain 7, an insulation layer 8 and a pixel electrode 9 which are sequentially formed on the base substrate 1.

No matter an array substrate is an array substrate of bottom-gate type or an array substrate of top-gate type, components need to be patterned using a mask plate during manufacturing thereof at least comprises a pattern of gate, a pattern of active layer, a pattern of etching blocking layer, a pattern of source and drain, a pattern of insulating layer and a pattern of pixel electrodes. Therefore, six mask patterning processes are needed for manufacturing the above array substrate, thus the manufacturing process is complicated, the number of the manufacturing procedures is large, the cost is high, and the time consumption is long.

Hence, how to simplify the manufacturing process of the array substrate is a problem to be solved by persons skilled in the art.

SUMMARY OF THE INVENTION

Embodiments of the invention provide an array substrate and a manufacturing thereof, a liquid crystal display panel and a display device, which can simplify the manufacturing process of the array substrate.

An embodiment of the invention provides an array substrate comprising a base substrate, and thin film transistors and pixel electrodes provided on the base substrate, wherein the thin film transistor comprises a gate and an active layer which are insulated from each other, and a drain and a source which are electrically connected to the active layer, a pixel electrode is electrically connected to a drain, wherein the pixel electrode and the active layer are provided in the same layer, the material forming the active layer is transparent oxide semiconductor material, the material forming the pixel electrode is a material obtained by performing plasma treatment on the transparent oxide semiconductor material.

In the above array substrate in the embodiment of the invention, the active layer is formed of transparent oxide semiconductor material. The concentration of carriers in the oxide semiconductor material may be increased by performing a plasma process on the oxide semiconductor material, thus the pixel electrode may be manufactured by using the oxide semiconductor material used for manufacturing the active layer, thereby the pixel electrode and the active layer can be provided in the same layer. As such, when the array substrate is manufactured, no new patterning process for manufacturing the pixel electrode is required, and the active layer and the pixel electrode can be manufactured simultaneously by only changing pattern of corresponding film layer, thus the number of the masks can be reduced, the manufacturing process is simplified, the production cost is saved, the productivity is increased, and the manufacturing time is shortened.

Specifically, in order to facilate to implement, in the array substrate according to the embodiment in the invention, in the thin film transistor:

the active layer is provided above the drain and the source; and both of the drain and the source are provided above the gate.

Alternatively, in order to facilate to implement, in the array substrate according to the embodiment in the invention, in the thin film transistor:

the active layer is provided above the drain and the source; and the gate is provided above the active layer.

Alternatively, in order to facilate to implement, in the array substrate according to the embodiment in the invention, in the thin film transistor:

both of the drain and the source are provided above the active layer; and the gate is provided below the active layer.

Alternatively, in order to facilate to implement, in the array substrate according to the embodiment in the invention, in the thin film transistor:

both of the drain and the source are provided above the active layer; and the gate is provided above the drain and the source.

Preferably, in order to avoid the damage of the oxide active layer below the source and the drain in a patterning process for forming the source and the drain, the array substrate according to the embodiment further comprises an etching blocking layer between the source and the drain and the active layer.

Furthermore, the array substrate according to the embodiment further comprises a common electrode insulated from the pixel electrodes.

Embodiment of the invention also provides a liquid crystal display panel comprising the array substrate according to the embodiment in the invention.

Embodiment of the invention also provides a display device comprising the liquid crystal display panel according to the embodiment in the invention.

Embodiment of the invention also provides a manufacturing method of any one of above array substrates according to the embodiment in the invention, which comprises:

forming a pattern including thin film transistors and pixel electrodes on a base substrate;

a pattern including active layers of the thin film transistors and pixel electrodes is formed by using a single patterning process; and a plasma treatment is performed on the pattern of the pixel electrodes.

In the manufacturing method of above array substrate according to embodiment in the invention, as the pattern including active layers of the thin film transistors and pixel electrodes is formed by using a single patterning process, compared to the manufacturing method of array substrate in the prior art, no new patterning process for manufacturing the pixel electrode is required, and the active layer and the pixel electrode can be manufactured simultaneously by only changing pattern of corresponding film layer, thus the number of the masks can be reduced, the manufacturing process is simplified, the production cost is saved, the productivity is increased, and the manufacturing time is shortened.

DETAILED DESCRIPTION OF THE EMBODIMENTS

Figure 1:
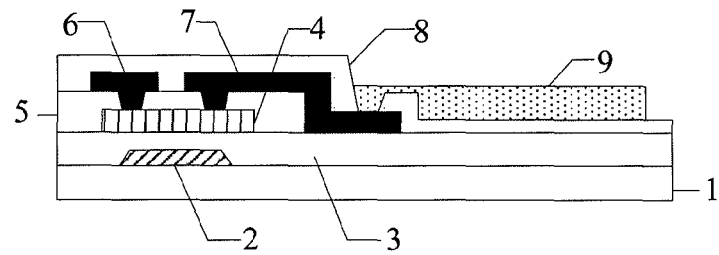
FIG. 1 is a structural diagram illustrating an array substrate in the prior art.

Implementations of an array substrate and a manufacturing method thereof, a liquid crystal panel and a display device of the invention will be described in detail below in conjunction with drawings.

The size and shape of each of film layers in the drawings do not reflect an actual proportion of the array substrate, and the drawings just illustrate partial structure of the array substrate and are only used to exemplify the invention.

An embodiment of the invention provides an array substrate, and one pixel unit in the array substrate will be described as an example below, as shown in FIG. 2a to FIG. 2d, the array substrate comprises a base substrate 01, and a thin film transistor 02 and a pixel electrode 03 formed on the base substrate 01, wherein the thin film transistor 02 comprises a gate 021 and an active layer 022 which are insulated from each other, and a source 023 and a drain 024 electrically connected to the active layer 022 respectively. The source 023 is electrically connected to the drain 024.

The pixel electrode 03 and the active layer 022 are provided in the same layer, the active layer 022 is formed of transparent oxide semiconductor material, and the pixel electrode 03 is formed of the transparent oxide semiconductor material subjected to a plasma treatment.

Specifically, in the above array substrate in the embodiment of the invention, as shown in FIG. 2a to FIG. 2d, insulation between the gate 021 and the active layer 022 may be achieved by providing a gate insulating layer 04 therebetween.

In the above array substrate in the embodiment of the invention, the active layer is formed of transparent oxide semiconductor material. The concentration of carriers in the oxide semiconductor material may be increased by performing a plasma process on the oxide semiconductor material, thus the pixel electrode may be manufactured by using the oxide semiconductor material used for manufacturing the active layer, thereby the pixel electrode and the active layer can be provided in the same layer. As such, when the array substrate is manufactured, no new patterning process for manufacturing the pixel electrode is required, and the active layer and the pixel electrode can be manufactured simultaneously by only changing pattern of corresponding film layer, thus the number of the masks can be reduced, the manufacturing process is simplified, the production cost is saved, the productivity is increased, and the manufacturing time is shortened.

Preferably, in the above array substrate in the embodiment of the invention, the active layer may be made of Indium gallium zinc oxide (IGZO), Zinc Oxide (ZnO), Indium zinc oxide (IZO) or Tin indium zinc oxide (ITZO), of course, the active layer may be made of other materials, which is not limited herein, as long as solutions of the invention can be realized.

Figure 2A:
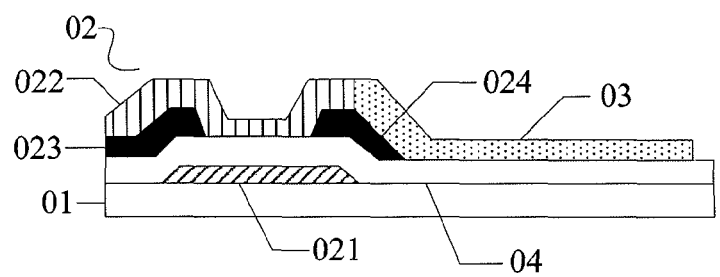
FIG. 2a to FIG. 2d are structural diagrams illustrating an array substrate according to the embodiment of the invention respectively.
Figure 2B:
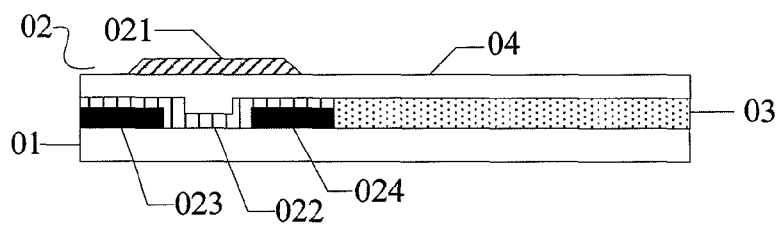

In implementing, in the above array substrate in the embodiment of the invention, as shown in FIG. 2a and FIG. 2b, an active layer 022 may be provided above a source 023 and a drain 024, therefore, manufacturing of an etching blocking layer can be omitted, thus a patterning process for forming the pattern of the etching blocking layer can be cancelled, thereby the number of masks can be reduced, the manufacturing procedure can be simplified, the manufacturing cost can be reduced, the productivity can be increased, and the manufacturing time can be shortened. Specifically, as shown in FIG. 2a, the thin film transistor 02 may be of bottom-gate-type structure, that is, in the thin film transistor 02, both of the source 023 and the drain 024 are above the gate 021. Alternatively, as shown in FIG. 2b, the thin film transistor 02 may be of top-gate-type structure, that is, in the thin film transistor 02, the gate 021 is above the active layer 022.

Figure 2C:
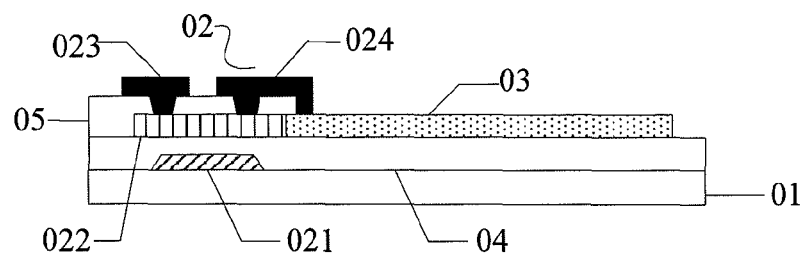
Figure 2D:
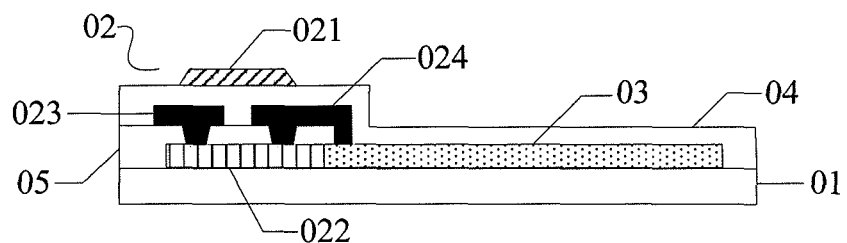

Of course, in implementing, in the above array substrate in the embodiment of the invention, as shown in FIG. 2c and FIG. 2d, both of the source 023 and the drain 024 may also be provided above the active layer 022. Specifically, as shown in FIG. 2c, the thin film transistor 02 may be of bottom-gate-type structure, that is, in the thin film transistor 02, the gate 021 is below the active layer 022. Alternatively, as shown in FIG. 2d, the thin film transistor 02 may be of top-gate-type structure, that is, in the thin film transistor 02, the gate 021 is above the source 023 and the drain 024.

Preferably, in the above array substrate in the embodiment of the invention, in a case of both of the source 023 and the drain 024 being above the active layer 022, as shown in FIG. 2c and FIG. 2d, in order to avoid the damage of the oxide active layer 022 below the source 023 and the drain 024 in a patterning process for forming the source 023 and the drain 024, the array substrate may further comprises an etching blocking layer 05 provided between the source 023 and the drain 024 and the active layer 022.

Further, the above array substrate according to the embodiment in the invention may be applied to liquid crystal display panel of Advanced-Super Dimensional Switching type and liquid crystal display panel of In-Plane Switching type, that is, the above array substrate may further comprise a common electrode insulated from the pixel electrode 03. Alternatively, the above array substrate according to the embodiment in the invention may also be applied to liquid crystal display panel of Twisted Nematic type, which is not limited herein.

Based on the same inventive concept, the embodiment of the invention further provides a liquid crystal display panel, which comprises the array substrate according to the embodiment in the invention, persons skilled in the art should understand that other constituent parts necessary for the liquid crystal display panel are also provided in the liquid crystal display panel, which should not be understood as limitation to the invention and description of which is omitted herein. Implementation of the liquid crystal display panel can refer to that of the above array substrate, and which is not repeatedly described herein.

Based on the same inventive concept, the embodiment of the invention also provides a display device, which comprises the above liquid crystal display panel according to the embodiment in the invention, the display device may be a mobile phone, a tablet computer, a TV, a display, a notebook computer, a digital image frame, a navigator and any other product or component with display function. Persons skilled in the art should understand that other constituent parts necessary for the display device are also provided in the display device, which should not be understood as limitation to the invention and description of which is omitted herein. Implementation of the display device can refer to that of the above liquid crystal display panel, which is not repeatedly described herein.

Based on the same inventive concept, the embodiment of the invention also provides a manufacturing method of any one of above array substrates, which comprises:

forming a pattern including thin film transistors and pixel electrodes on a base substrate;

a pattern including active layers of the thin film transistors and pixel electrodes is formed by using a single patterning process; and a plasma treatment is performed on the pattern of the pixel electrodes so as to increase the concentration of the carriers in the pixel electrodes.

In the manufacturing method of above array substrate according to embodiment in the invention, as the pattern including active layers of the thin film transistors and pixel electrodes is formed by using a single patterning process, compared to the manufacturing method of array substrate in the prior art, no new patterning process for manufacturing the pixel electrode is required, and the active layer and the pixel electrode can be manufactured simultaneously by only changing pattern of corresponding film layer, thus the number of the masks can be reduced, the manufacturing process is simplified, the production cost is saved, the productivity is increased, and the manufacturing time is shortened.

Preferably, in order to further decrease the number of masks so as to reduce manufacturing cost, in the manufacturing method according to the embodiment in the invention, before forming the pattern of the active layer in the thin film transistor, the pattern including the source and the drain may be first formed, thus manufacturing of an etching blocking layer can be omitted, thus a patterning process for forming the pattern of the etching blocking layer can be cancelled, thereby the number of masks can be further reduced, the manufacturing procedure can be simplified, the manufacturing cost can be reduced, the productivity can be increased, and the manufacturing time can be shortened.

Hereinafter, description of the manufacturing method of above array substrate will be explained by taking manufacturing the array substrate shown in FIG. 2a as an example.

Figure 3A:
FIG. 3a to FIG. 3d are side views illustrating steps in a manufacturing method of the array substrate according to an embodiment of the invention respectively.
Figure 3B:
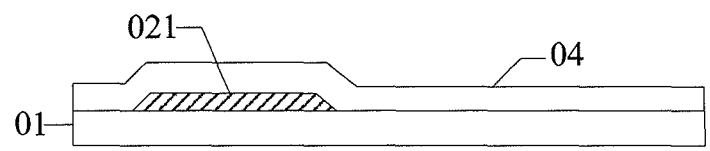
Figure 3C:
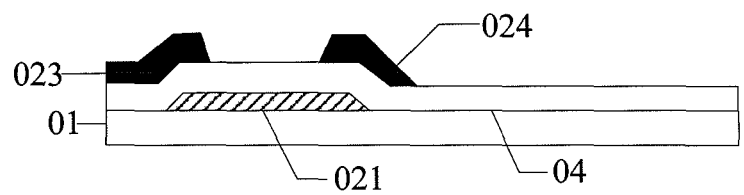
Figure 3D:
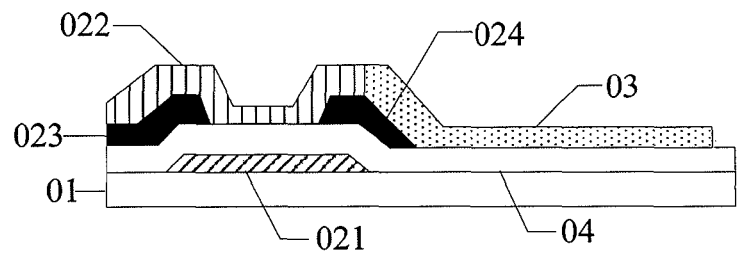
Figure 4A:
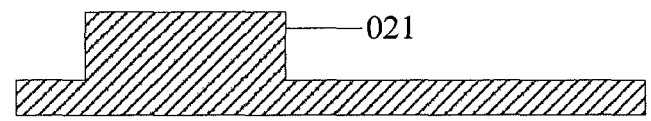
FIG. 4a to FIG. 4d are top views illustrating steps in a manufacturing method of the array substrate according to an embodiment of the invention respectively.
Figure 4B:
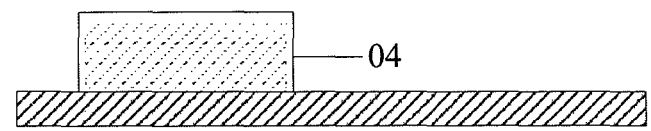
Figure 4C:
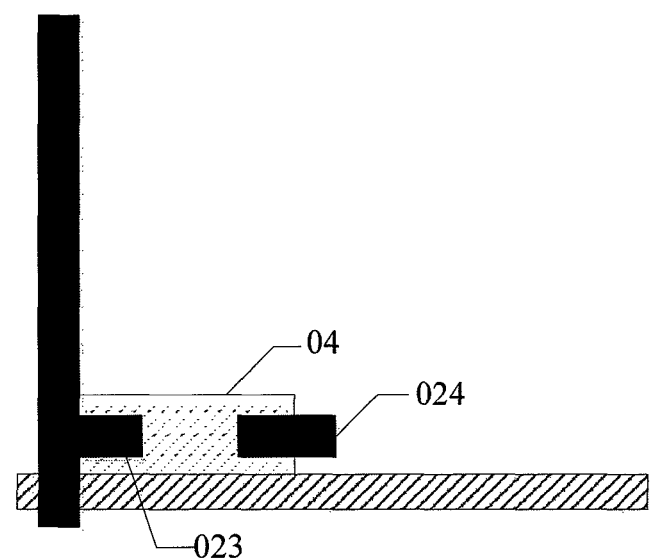
Figure 4D:
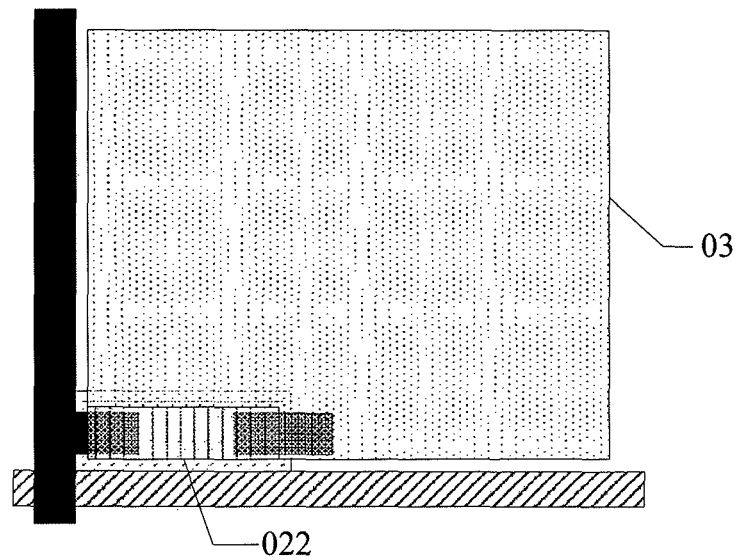

Specifically, the procedure of manufacturing the array substrate shown in FIG. 2a may comprise following steps:

(1) forming a pattern of gate 021 on a base substrate 01, as shown in FIG. 3a and FIG. 4a;

(2) depositing a gate insulating layer 04 above the gate 021, as shown in FIG. 3b and FIG. 4b;

(3) forming a pattern including a source 023 and a drain 024 on the gate insulating layer 04 through a single patterning process, as shown in FIG. 3c and FIG. 4c;

(4) forming a pattern including an active layer 022 and a pixel electrode 03 above the source 023 and the drain 024 through a single patterning process, as shown in FIG. 3d and FIG. 4d;

wherein, FIG. 4a to FIG. 4d are top views corresponding to FIG. 3a to FIG. 3d, respectively.

Figure 5A:
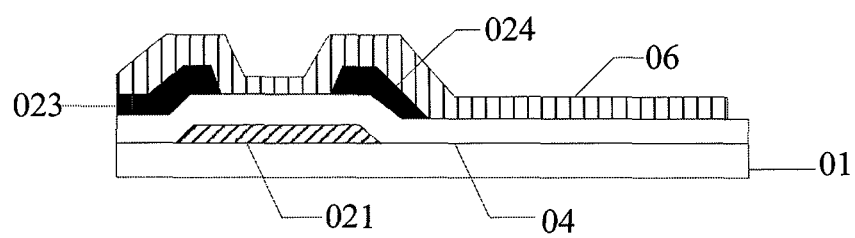
FIG. 5a to FIG. 5e are side views illustrating specific steps of step (4) in the manufacturing method of the array substrate according to the embodiment of the invention respectively.
Figure 5B:
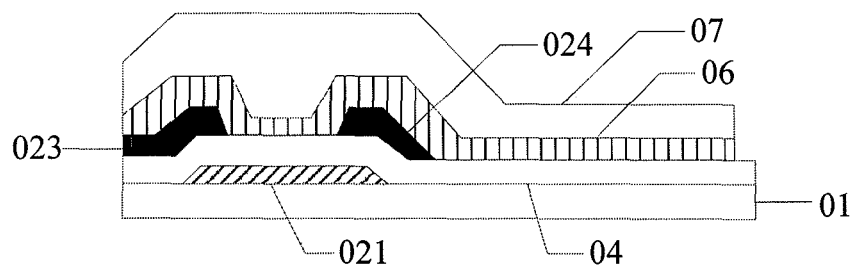
Figure 5C:
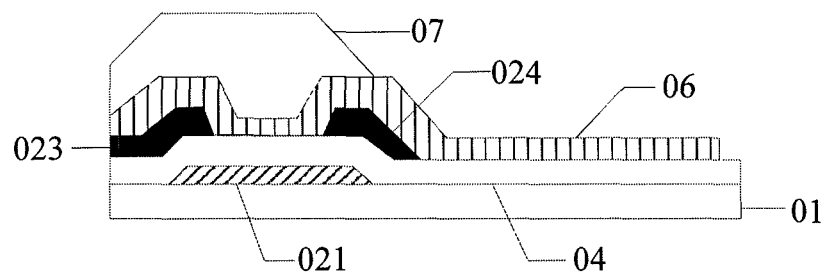
Figure 5D:
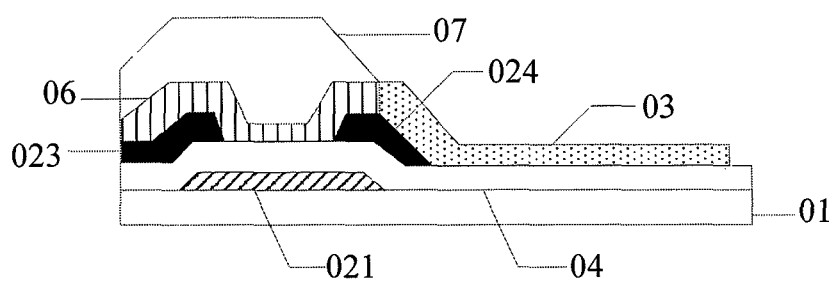

Specifically, taking forming the pattern including the active layer and the pixel electrode using zinc oxide through a single patterning process as an example, the step (4) in the manufacturing method of above array substrate according to the embodiment in the invention may specifically comprise:

First, depositing zinc oxide 06 above the source 023 and the drain 024, as shown in FIG. 5a;

Then, applying photoresist 07 on the zinc oxide 06, as shown in FIG. 5b;

Next, performing exposure and development on the photoresist 07 using a mask plate, as shown in FIG. 5c;

Then, performing plasma treatment on parts of the zinc oxide 06 not being covered by the photoresist 07 so as to obtain a pattern of the pixel electrode 03, as shown in FIG. 5d;

Preferably, in order to obtain an optimal effect of the plasma treatment, after performing exposure and development on the photoresist 07 and before performing plasma treatment on parts of the zinc oxide 06 not being covered by the photoresist 07, a polishing process may be performed on the zinc oxide 06.

Figure 5E:
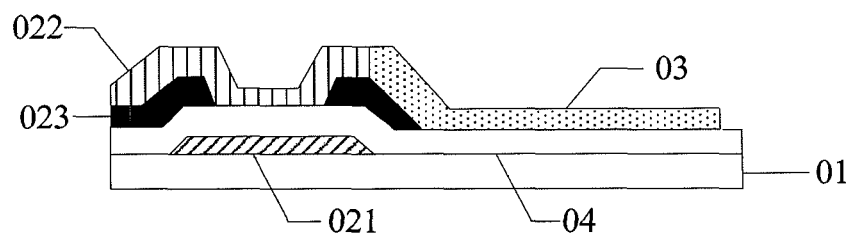

Finally, peeling off the remained photoresist 07 so as to obtain a pattern of active layer 022, as shown in FIG. 5e;

In addition, array substrates shown in FIGS. 2b, 2c and 2d may be manufactured in the similar manner, description of which is omitted herein.

In the manufacturing method of above array substrate according to the embodiment in the invention, the pixel electrode and the active layer are formed through a single patterning process, wherein three patterning processes with mask in total are used in manufacturing the pattern including the thin film transistor and the pixel electrode as shown in FIG. 2a and FIG. 2b, and four patterning processes with mask in total are used in manufacturing the pattern including the thin film transistor and the pixel electrode as shown in FIG. 2c and FIG. 2d. However, in the manufacturing method of array substrate in the prior art, six patterning processes with mask in total are used in manufacturing the pattern including the thin film transistor and the pixel electrode, therefore, compared to the prior art, in the manufacturing method in the invention, the number of the masks can be reduced, the manufacturing process is simplified, the production cost is saved, the productivity is increased, and the manufacturing time is shortened.

It should be noted that, in the manufacturing method of above array substrate according to the embodiment in the invention, the patterning process may only include the lithography process, or, may include the lithography process and etching steps, as well as other processes for forming predefined patterns, such as printing, ink ejecting and so on. The lithography process refers to a process including film generating, exposure, development, etc. for forming a pattern using photoresist, mask plate, and exposing machine. In specific implementing, corresponding processes may be selected according to structures to be formed in the invention.

Embodiments of the invention provide an array substrate and a manufacturing method thereof, a liquid crystal display panel and a display device, the array substrate comprises a base substrate, and thin film transistors and pixel electrodes provided on the base substrate, wherein the thin film transistor comprises a gate and an active layer which are insulated from each other, and a drain and a source which are electrically connected to the active layer, a pixel electrode is electrically connected to a drain, wherein the pixel electrode and the active layer are provided in the same layer, the material forming the active layer is transparent oxide semiconductor material, the material forming the pixel electrode is a material obtained by performing plasma treatment on the transparent oxide semiconductor material. In the above array substrate, the active layer is formed of transparent oxide semiconductor material, and the concentration of carriers in the oxide semiconductor material may be increased by performing a plasma process on the oxide semiconductor material, thus the pixel electrode may be manufactured by using the oxide semiconductor material used for manufacturing the active layer, thereby the pixel electrode and the active layer can be provided in the same layer. As such, when the array substrate is manufactured, no new patterning process for manufacturing the pixel electrode is required, and the active layer and the pixel electrode can be manufactured simultaneously by only changing pattern of corresponding film layer, thus the number of the masks can be reduced, the manufacturing process is simplified, the production cost is saved, the productivity is increased, and the manufacturing time is shortened.

It will be appreciated that, the foregoing embodiments are exemplary embodiments merely for describing the principle of the present invention, but the present invention is not limited thereto. A person of ordinary skill in the art may make various variations and improvements without departing from the spirit and essence of the present invention. However, these variations and improvements are considered to be within the protection scope of the present invention.

The invention claimed is:

1. An array substrate comprising a base substrate, and thin film transistors and pixel electrodes provided on the base substrate, wherein the thin film transistor comprises a gate and an active layer which are insulated from each other, and a drain and a source which are electrically connected to the active layer, a pixel electrode is electrically connected to a drain, wherein
   the pixel electrode and the active layer are provided in the same layer and are formed integratedly, wherein the pixel electrode and the active layer are connected together, the material forming the active layer is transparent oxide semiconductor material, the material forming the pixel electrode is a material obtained by performing plasma treatment on the transparent oxide semiconductor material forming the active layer.

2. The array substrate of claim 1, wherein in the thin film transistor:
   the active layer is provided above the drain and the source; and
   both of the drain and the source are provided above the gate.

3. The array substrate of claim 1, wherein in the thin film transistor:
   the active layer is provided above the drain and the source; and
   the gate is provided above the active layer.

4. The array substrate of claim 1, wherein in the thin film transistor:
   both of the drain and the source are provided above the active layer; and
   the gate is provided below the active layer.

5. The array substrate of claim 1, wherein in the thin film transistor:
   both of the drain and the source are provided above the active layer; and
   the gate is provided above the drain and the source.

6. The array substrate of claim 4, further comprises an etching blocking layer between the source and the drain and the active layer.

7. The array substrate of claim 5, further comprises an etching blocking layer between the source and the drain and the active layer.

8. The array substrate of claim 1, further comprises a common electrode insulated from the pixel electrodes.

9. A display device comprising the array substrate of claim 1.

10. The display device of claim 9, wherein in the thin film transistor:
    the active layer is provided above the drain and the source; and
    both of the drain and the source are provided above the gate.

11. The display device of claim 9, wherein in the thin film transistor:
    the active layer is provided above the drain and the source; and
    the gate is provided above the active layer.

12. The display device of claim 9, wherein in the thin film transistor:
    both of the drain and the source are provided above the active layer; and
    the gate is provided below the active layer.

13. The display device of claim 12, the array substrate further comprises an etching blocking layer between the source and the drain and the active layer.

14. The display device of claim 9, wherein in the thin film transistor:
    both of the drain and the source are provided above the active layer; and
    the gate is provided above the drain and the source.

15. The display device of claim 14, the array substrate further comprises an etching blocking layer between the source and the drain and the active layer.

16. The display device of claim 9, the array substrate further comprises a common electrode insulated from the pixel electrodes.

17. A manufacturing method of array substrate comprising forming a pattern including thin film transistors and pixel electrodes on a base substrate, wherein the array substrate comprises a base substrate, and thin film transistors and pixel electrodes provided on the base substrate, and wherein the thin film transistor comprises a gate and an active layer which are insulated from each other, and a drain and a source which are electrically connected to the active layer, a pixel electrode is electrically connected to a drain, wherein the pixel electrode and the active layer are provided in the same layer and are formed integratedly, wherein the pixel electrode and the active layer are connected together, the material forming the active layer is transparent oxide semiconductor material, the material forming the pixel electrode is a material obtained by performing plasma treatment on the transparent oxide semiconductor material forming the active layer, wherein
    a pattern of active layers of the thin film transistors and pixel electrodes is formed by using a single patterning process; and
    a plasma treatment is performed on the pattern of the pixel electrodes.

* * * * *